(12) United States Patent
Qian

(10) Patent No.: US 11,456,371 B2
(45) Date of Patent: Sep. 27, 2022

(54) METHOD FOR MAKING LDMOS DEVICE AND LDMOS DEVICE

(71) Applicant: SHANGHAI HUAHONG GRACE SEMICONDUCTOR MANUFACTURING CORPORATION, Shanghai (CN)

(72) Inventor: Wensheng Qian, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 31 days.

(21) Appl. No.: 17/022,707

(22) Filed: Sep. 16, 2020

(65) Prior Publication Data

US 2021/0391448 A1 Dec. 16, 2021

(30) Foreign Application Priority Data

Jun. 11, 2020 (CN) .......................... 202010528014.6

(51) Int. Cl.
*H01L 21/26* (2006.01)
*H01L 29/10* (2006.01)
(Continued)

(52) U.S. Cl.
CPC .. *H01L 29/66681* (2013.01); *H01L 21/26513* (2013.01); *H01L 29/1095* (2013.01); *H01L 29/7816* (2013.01)

(58) Field of Classification Search
CPC . H01L 21/26; H01L 21/265; H01L 21/26513; H01L 29/10; H01L 29/1095;
(Continued)

(56) References Cited

U.S. PATENT DOCUMENTS

| 2013/0140632 A1* | 6/2013 | Landgraf .......... H01L 29/66659 438/286 |
| 2014/0021543 A1* | 1/2014 | Ito ....................... H01L 29/7835 257/343 |

(Continued)

FOREIGN PATENT DOCUMENTS

| CN | 1976057 A | 6/2007 |
| CN | 104701368 A | 6/2015 |

OTHER PUBLICATIONS

Search Report issued in corresponding Chinese Patent Application No. 2020105280146, dated Jul. 29, 2021.

*Primary Examiner* — Fazli Erdem
(74) *Attorney, Agent, or Firm* — MKG, LLC

(57) ABSTRACT

The application discloses a method for making an LDMOS device and an LDMOS device, the method comprising steps of: forming a well doped region in a substrate; forming a gate oxide on the substrate; forming a polysilicon gate on the gate oxide, wherein the polysilicon gate and the gate oxide form a step structure; performing drift region ion implantation at least two times to form a drift region in the substrate, wherein the drift region covers the well doped region and the bottom of the gate oxide, and in the at least two times of drift region ion implantation, there is a difference in energy between at least two times of drift region ion implantation; and performing heavily doped ion implantation, to separately form a source terminal and a channel lead-out terminal in the well doped region and to form a drain terminal in the drift region.

15 Claims, 6 Drawing Sheets

(51) Int. Cl.
*H01L 29/66* (2006.01)
*H01L 29/78* (2006.01)
*H01L 21/265* (2006.01)

(58) Field of Classification Search
CPC ............... H01L 29/66; H01L 29/66681; H01L 29/7816
USPC ........................................................ 257/343
See application file for complete search history.

(56) References Cited

U.S. PATENT DOCUMENTS

| | | | |
|---|---|---|---|
| 2014/0131796 A1* | 5/2014 | Zhou | H01L 29/66681 438/286 |
| 2015/0001621 A1 | 1/2015 | Takada | |
| 2016/0190310 A1* | 6/2016 | Yu | H01L 29/7816 438/286 |

* cited by examiner

METHOD FOR MAKING LDMOS DEVICE AND LDMOS DEVICE

CROSS-REFERENCES TO RELATED APPLICATIONS

This application claims priority to Chinese patent application No. CN202010528014.6, filed on Jun. 11, 2020, and entitled "METHOD FOR MAKING LDMOS DEVICE AND LDMOS DEVICE", the disclosure of which is incorporated herein by reference in entirety.

TECHNICAL FIELD

The application relates to the field of semiconductor manufacturing technologies, in particular to a method for making a laterally-diffused metal-oxide semiconductor (LDMOS) device and an LDMOS device.

BACKGROUND

In order to reduce switching power consumption, LDMOS devices, especially switching LDMOS devices, generally require a sufficiently low on-resistance for maintaining a sufficiently high breakdown voltage.

Accordingly, the LDMOS device provided in the related art usually has a relatively small device size (e.g., a relatively short channel length and/or a relatively short drift region length), or has a relatively high drift region doping concentration on the basis of the relatively small device size. In this way, the resistance of the drift region is reduced by increasing the doping concentration of the drift region, and the on-resistance of the device is reduced by reducing the device size.

However, the LDMOS device provided in the related art has a relatively high probability of breakdown, resulting in poor device stability.

BRIEF SUMMARY

According to some embodiments in this application, a method for making an LDMOS device is disclosed in the following steps:

forming a well doped region in a substrate;

forming a gate oxide on the substrate, wherein there is an overlap region between the bottom of the gate oxide and an upper surface of the well doped region;

forming a polysilicon gate on the gate oxide, wherein the polysilicon gate and the gate oxide form a step structure, and the gate oxide forms a bottom step of the step structure;

performing drift region ion implantation at least two times to form a drift region in the substrate, wherein the drift region covers the well doped region and the bottom of the gate oxide, and in the at least two times of drift region ion implantation, there is a difference in energy between at least two times of drift region ion implantation; and performing heavily doped ion implantation, to separately form a source terminal and a channel lead-out terminal in the well doped region and to form a drain terminal in the drift region.

In example embodiments, the at least two times of drift region ion implantation comprise first ion implantation and second ion implantation performed in sequence, and energy of the second ion implantation is less than energy of the first ion implantation.

In example embodiments, the energy of the first ion implantation is 150 KeV (KeV) to 350 KeV.

In example embodiments, ions of the first ion implantation comprise a first-type impurity, and in the first ion implantation, an implantation dose of the first-type impurity is $1.5 \times 10^{12}/cm^{-2}$ to $3.5 \times 10^{12}/cm^{-2}$.

In example embodiments, the energy of the second ion implantation is 50 KeV to 120 KeV.

In example embodiments, ions of the second ion implantation comprise a first-type impurity, and in the second ion implantation, an implantation dose of the first-type impurity is $2 \times 10^{12}/cm^{-2}$ to $4.5 \times 10^{12}/cm^{-2}$.

In example embodiments, the at least two times of drift region ion implantation comprise first-type ion implantation and second-type ion implantation performed in sequence, and energy of the first-type ion implantation is greater than energy of the second-type ion implantation; and the first ion implantation and the second ion implantation belong to the first-type ion implantation.

In example embodiments, the first-type ion implantation comprises third ion implantation and fourth ion implantation performed in sequence, ions of the third ion implantation comprise a second-type impurity, and ions of the fourth ion implantation comprise a first-type impurity.

In example embodiments, energy of the third ion implantation is 550 KeV to 950 KeV.

In example embodiments, in the third ion implantation, an implantation dose of a second-type impurity is $1.5 \times 10^{12}/cm^{-2}$ to $3.5 \times 10^{12}/cm^{-2}$.

In example embodiments, energy of the fourth ion implantation is 350 KeV to 750 KeV.

In example embodiments, in the fourth ion implantation, an implantation dose of a first-type impurity is $1 \times 10^{12}/cm^{-2}$ to $3 \times 10^{12}/cm^{-2}$.

According to some embodiments in this application, an LDMOS device, comprising:

a substrate, wherein a drift region is formed in the substrate, a well doped region is formed in the drift region, a doping concentration distribution in the drift region is nonuniform in a lateral direction, a source terminal and a channel lead-out terminal of the LDMOS device are formed in the well doped region, and a drain terminal of the LDMOS device is formed in the drift region;

a gate oxide, wherein the gate oxide is formed on the substrate, and there is an overlap region between the bottom of the gate oxide and an upper surface of the well doped region; and a polysilicon gate, wherein the polysilicon gate and the gate oxide form a step structure, and the gate oxide forms a bottom step of the step structure.

In example embodiments, the gate oxide is a step oxide, the step oxide comprises a high step portion and a low step portion, and the thickness of the high step portion is greater than the thickness of the low step portion.

In example embodiments, in the drift region, the doping concentration of a first region is greater than the doping concentration of a second region, the doping concentration of a third region is greater than the doping concentration of the second region, and the doping concentration of the first region is greater than the doping concentration of the third region; and the first region is a region below the high step portion where no polysilicon gate is formed thereon, the second region is a region below the high step portion where the polysilicon gate is formed thereon, and the third region is a region below the low step portion where the polysilicon gate is formed thereon.

The technical solutions of the application at least have the following advantages:

in the process of making an LDMOS device, after a gate oxide and a polysilicon gate are formed, drift region ion implantation is performed at least two times; during the drift region ion implantation, ions need to pass through a step structure formed by the gate oxide and the polysilicon gate and an exposed substrate, and the step structure have different thicknesses; and accordingly, a doping concentration distribution in a formed drift region is nonuniform in a lateral direction, such that during operation of the manufactured LDMOS device, there is a relatively uniform electric field in the drift region, thereby reducing the device breakdown probability and improving the device stability.

BRIEF DESCRIPTION OF THE DRAWINGS

In order to more clearly explain the specific implementations of the application or the technical solutions in the prior art, the drawings required in description of the specific implementations or the prior art will be briefly described below. It is obvious that the drawings described below are some implementations of the application, and one skilled in the art could also obtain other drawings on the basis of these drawings without contributing any inventive labor.

DETAILED DESCRIPTION OF THE DISCLOSURE

Figure 1:
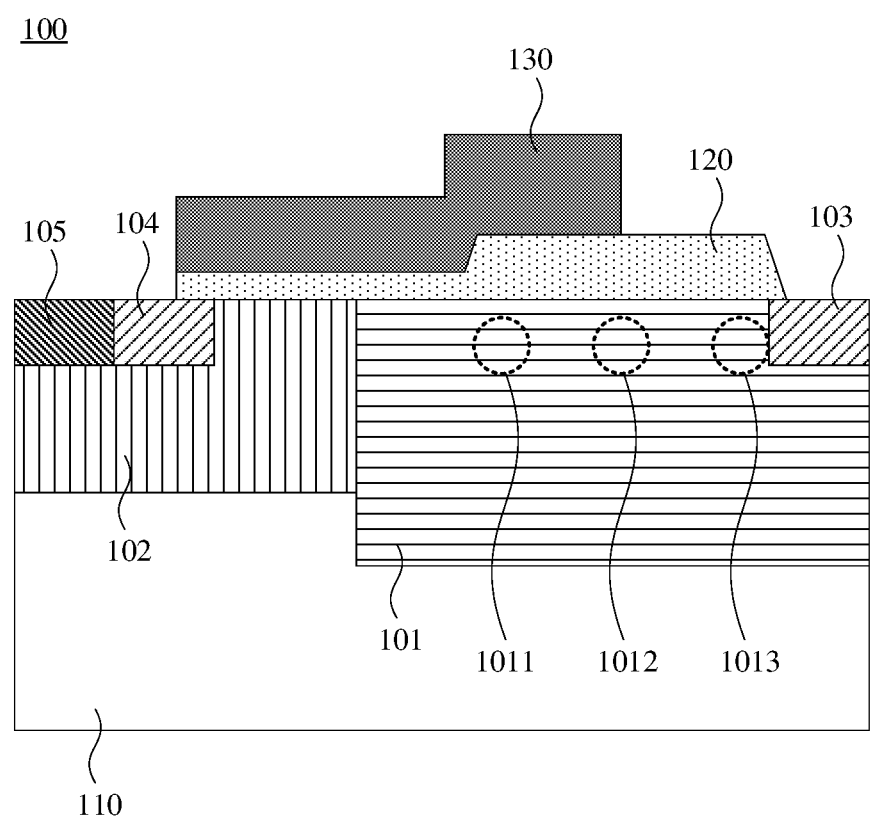
FIG. 1 is a schematic sectional view of an LDMOS device provided in the related art.

The technical solution of the application will be clearly and completely described below with reference to the drawings. Obviously, the described embodiments are part of the embodiments of the application, instead of all of them. Based on the embodiments in the application, all other embodiments obtained by one skilled in the art without contributing any inventive labor shall fall into the protection scope of the application.

In the description of the application, it should be noted that the orientation or position relationship indicated by the terms "center", "upper", "lower", "left", "right", "vertical", "horizontal", "inner", "outer", etc. is based on the orientation or position relationship shown in the drawings, intended only for the convenience of describing the application and simplifying the description, rather than indicating or implying that the apparatus or element referred to necessarily has a specific orientation or is configured or operated in a specific orientation, and thus cannot be construed as a limitation on the application. In addition, the terms "first", "second", and "third" are used for descriptive purposes only, and cannot be construed as indicating or implying relative importance.

In the description of the application, it should be noted that, unless otherwise clearly specified and limited, the terms "mounting", "coupling", and "connecting" should be understood in a broad sense, for example, a connection can be a fixed connection, a detachable connection, or an integrated connection, can be a mechanical connection or an electrical connection, can be a direct connection, an indirect connection implemented by means of an intermedium, or an internal connection between two components, and can be a wireless connection or a wired connection. One skilled in the art could understand the specific meanings of the above terms in the application on the basis of specific situations.

In addition, the technical features involved in different embodiments of the application described below can be combined with each other in the case of no conflict.

An LDMOS device provided in the related art usually has a relatively small device size, or has a relatively high drift region doping concentration on the basis of the relatively small device size, to improve the performance of the device. However, the relatively small device size and/or relatively high drift region doping concentration may reduce the reliability of the device, which is mainly manifested as: a peak electric field in the drift region of the device is relatively strong when a high voltage is applied to a drain terminal, and an electric field distribution in the drift region is nonuniform, in which case collision ionization is easy to occur, thereby causing breakdown; or the strong electric field causes the mobility of the device to decrease, increasing on-resistance of the device, thereby reducing the safe operating area of the device.

Referring to FIG. 1, which illustrates a schematic sectional view of the LDMOS device provided in the related art, it can be seen that the LDMOS device 100 includes a substrate 110, a gate oxide 120 formed on the substrate 110, and a polysilicon gate 130 formed on the gate oxide 120, wherein a drift region 101 and a well doped region 102 are formed in the substrate 110, a drain terminal 103 is formed in the drift region 101, and a source terminal 104 and a channel lead-out terminal 105 are formed in the well doped region 102.

In the drift region 101 of the LDMOS device 100, a first region 1011 close to the well doped region 102, a second region 1012 between the well doped region 102 and the drain terminal 103, and a third region 1013 close to the drain terminal 103 have different electric field intensities, which is manifested as: when the doping concentration of the drift region 101 is relatively high, peak electric field intensities of the first region 1011 and the second region 1012 are relatively high, and when the doping concentration of the drift region 101 is relatively low, a peak electric field intensity of the third region 1013 is relatively high.

In the related art, the drift region 101 of the LDMOS device 100 is generally formed by performing ion implantation doping on a region where the drift region 101 is located before the gate oxide 120 is formed on the substrate 110. During the ion implantation process, the doping concentration of the drift region 101 is relatively uniform in a lateral direction, rendering the electric field distribution in the drift region 101 nonuniform. When the voltage of the polysilicon gate 130 is relatively low, regions (the first region 1011 and the second region 1012) at the edge of the polysilicon gate 130 have a relatively high peak electric field intensity, and when the voltage of the polysilicon gate 130 is relatively high, regions (the third region 1013 and the fourth region 1014) close to the drain terminal 103 have a relatively high peak electric field intensity. The nonuniform electric field distribution affects the safe operating area of the device.

Figure 2:
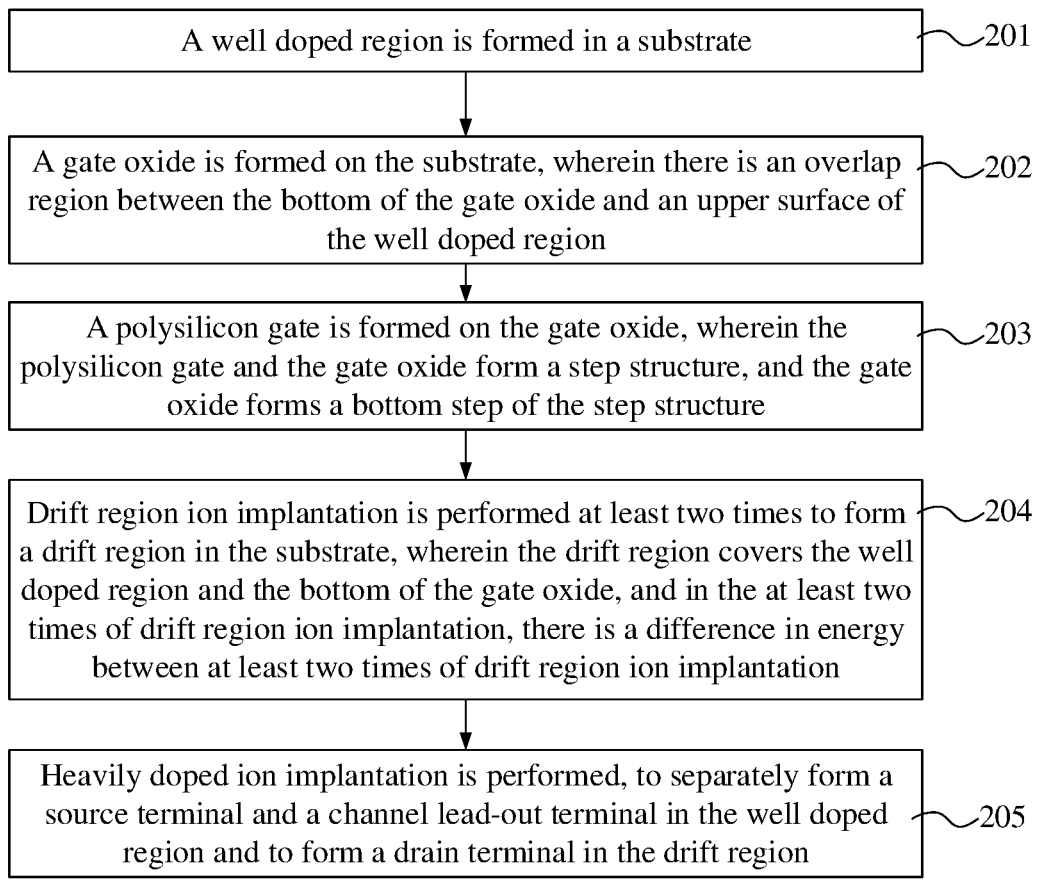
FIG. 2 is a flowchart of a method for making an LDMOS device provided in an exemplary embodiment of the application.

Referring to FIG. 2, which illustrates a flowchart of a method for making an LDMOS device provided in an exemplary embodiment of the application, the method includes the following content.

Step 201: A well doped region is formed in a substrate.

Figure 3:
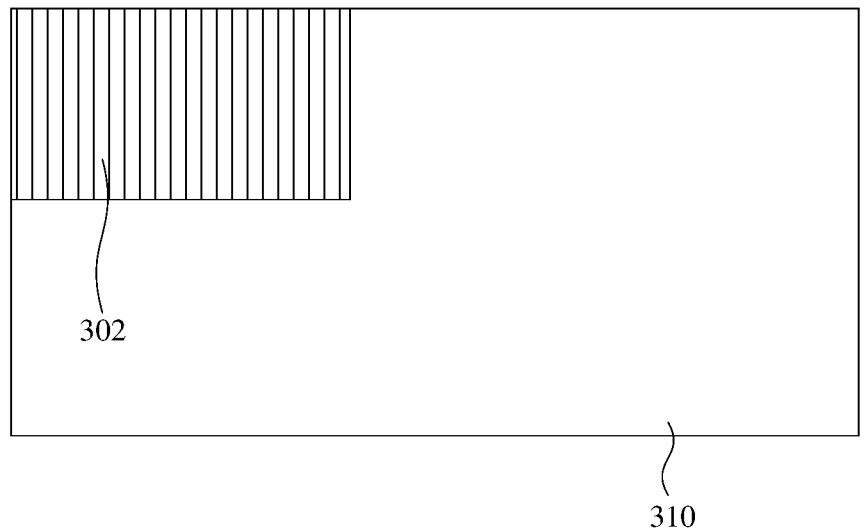
FIG. 3 is a schematic sectional view obtained after a well doped region is formed in a substrate in the method for making an LDMOS device provided in an exemplary embodiment of the application.

Referring to FIG. 3, which illustrates a schematic sectional view obtained after the well doped region is formed in the substrate, it can be seen that the well doped region 302 is formed in the substrate 310 by means of ion implantation.

Step 202: A gate oxide is formed on the substrate, wherein there is an overlap region between the bottom of the gate oxide and an upper surface of the well doped region.

Step 203: A polysilicon gate is formed on the gate oxide, wherein the polysilicon gate and the gate oxide form a step structure, and the gate oxide forms a bottom step of the step structure.

Figure 4:
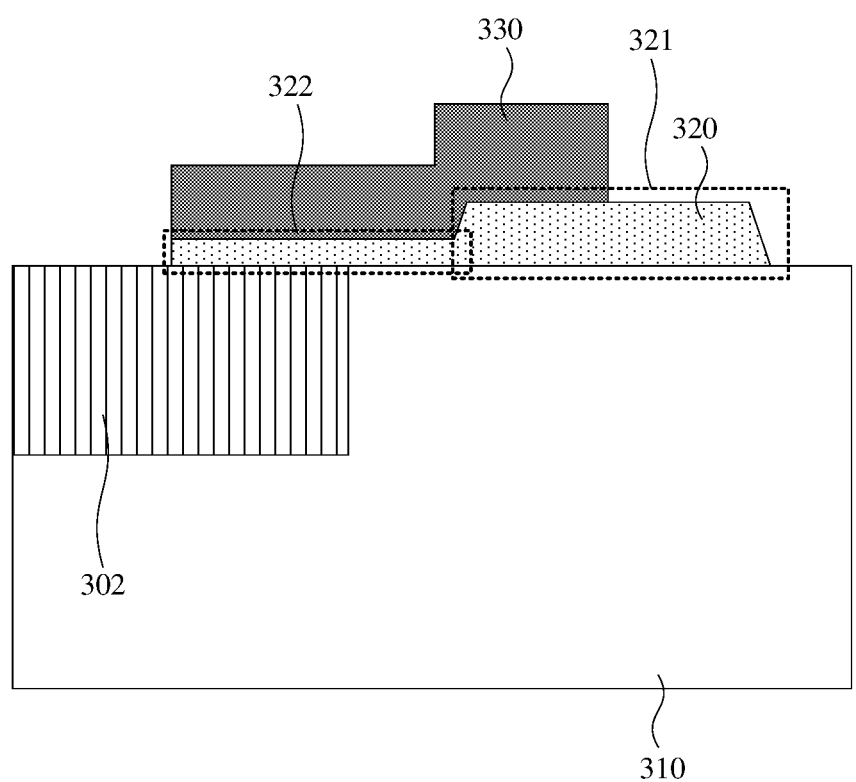
FIG. 4 is a schematic sectional view obtained after a gate oxide and a polysilicon gate are formed on the substrate in the method for making an LDMOS device provided in an exemplary embodiment of the application.

Referring to FIG. 4, which illustrates a schematic sectional view obtained after the gate oxide and the polysilicon gate are formed on the substrate, it can be seen that the gate oxide 320 and the polysilicon gate 330 formed thereon form the step structure, the gate oxide 320 forms the bottom step of the step structure, the gate oxide 320 and a sidewall on one side of the polysilicon gate 330 are in the same plane, and the other side of the gate oxide 320 extends to be exposed.

In example embodiments, the gate oxide 320 is a step oxide including a high step portion 321 and a low step portion 322, the thickness of the high step portion 321 is greater than the thickness of the low step portion 322, and a constituent material thereof includes a silicon oxide (SiO) layer and/or a silicon dioxide ($SiO_2$) layer.

In example embodiments, a process of preparing the step oxide 320 includes but is not limited to the following steps: forming an oxide layer (which includes silicon oxide and/or silicon dioxide) on the substrate 310 by means of a furnace tube oxidation process; forming a dielectric layer (which includes silicon oxide and/or silicon dioxide) on the oxide layer by means of a chemical vapor deposition (CVD) process; forming a hard mask layer (which may be a silicon nitride (SiN) layer) on the dielectric layer by means of a CVD process; etching the hard mask layer by means of a photolithography process to expose a region corresponding to the bottom step of the gate oxide 320 on the dielectric layer; etching the region by means of wet etching; and removing the hard mask layer by means of etching to form the step oxide 320.

In example embodiments, the gate oxide 320 has a local oxidation of silicon (LOCOS) structure.

In example embodiments, a polysilicon layer can be deposited on the substrate 310 and the gate oxide 320 by means of a CVD process, and the polysilicon layer can be etched by means of a photolithography process to form the polysilicon gate 330.

Step 204: Drift region ion implantation is performed at least two times to form a drift region in the substrate, wherein the drift region covers the well doped region and the bottom of the gate oxide, and in the at least two times of drift region ion implantation, there is a difference in energy between at least two times of drift region ion implantation.

Figure 5:
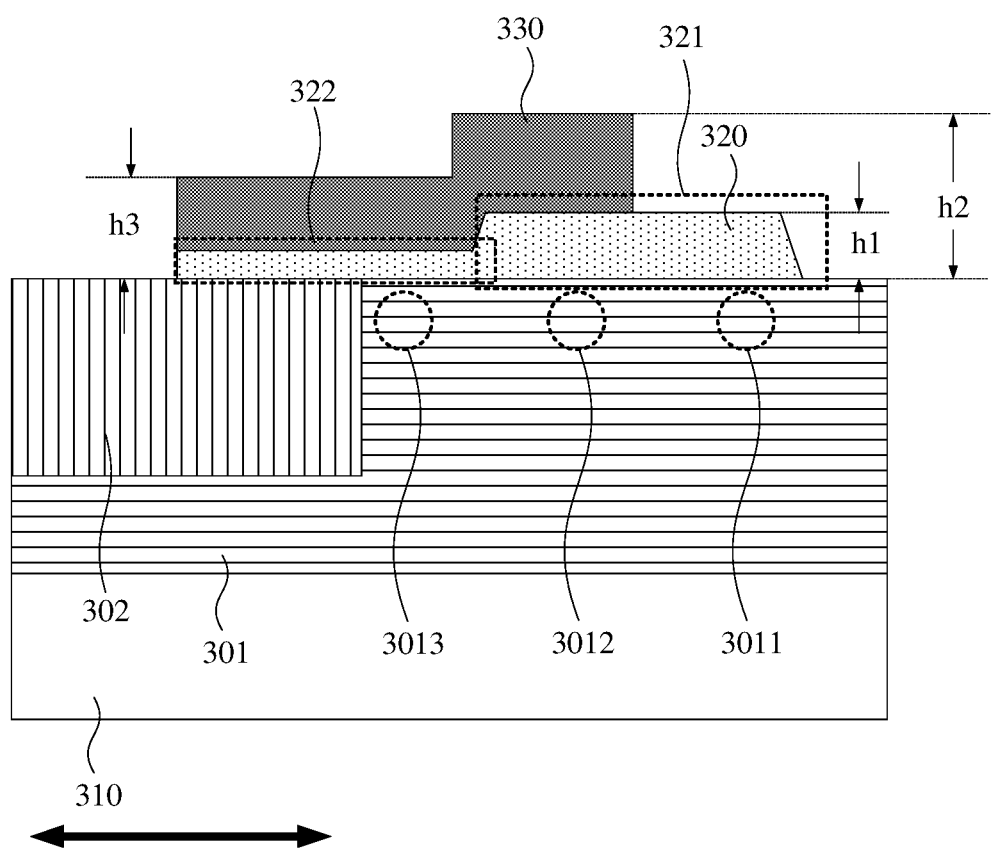
FIG. 5 is a schematic sectional view obtained after drift region ion implantation is performed at least two times to form a drift region in the method for making an LDMOS device provided in an exemplary embodiment of the application.

Referring to FIG. 5, which illustrates a schematic sectional view obtained after the drift region ion implantation is performed at least two times to form the drift region, it can be seen that a doping concentration distribution in the formed drift region 301 is nonuniform in a lateral direction (e.g., the direction represented by the arrow in FIG. 5). For example, as shown in FIG. 5, in the drift region 301, along the lateral direction, the doping concentration of the first region 3011 is greater than the doping concentration of the second region 3012, the doping concentration of the third region 3013 is greater than the doping concentration of the second region 3012, and the doping concentration of the first region 3011 is greater than the doping concentration of the third region 3013. The first region 3011 is a region below the high step portion 321 (i.e., below the high step portion 321 that extends to the outside) where no polysilicon gate 330 is formed thereon, the second region 3012 is a region below the high step portion 321 where the polysilicon gate 330 is formed thereon, and the third region 3013 is a region below the low step portion 322 where the polysilicon gate 330 is formed thereon.

In example embodiments, in step 204, the at least two times of drift region ion implantation include first ion implantation and second ion implantation performed in sequence, and energy of the second ion implantation is less than energy of the first ion implantation. In example embodiments, ions of the first ion implantation and the second ion implantation include a first-type impurity.

For example, after the polysilicon gate 330 is formed, the first ion implantation with energy E1 and a first-type impurity implantation dose D1 and the second ion implantation with energy E2 and a first-type impurity implantation dose D2 are performed in sequence, wherein E1>E2.

In example embodiments, the value range of E1 is 150 KeV to 350 KeV (for example, E1 can be 250 KeV, 300 KeV, or other values within the value range). In example embodiments, the value range of E2 is 50 KeV to 120 KeV (for example, E2 can be 50 KeV, 100 KeV, or other values within the value range).

In example embodiments, the value range of D1 is $1.5 \times 10^{12}/cm^{-2}$ to $3.5 \times 10^{12}/cm^{-2}$ (for example, D1 can be $3 \times 10^{12}/cm^{-2}$, $2.5 \times 10^{12}/cm^{-2}$, or other values within the value range); the value range of D2 is $1.5 \times 10^{12}/cm^{-2}$ to $3.5 \times 10^{12}/cm^{-2}$ (for example, D2 can be $2.5 \times 10^{12}/cm^{-2}$, $4 \times 10^{12}/cm^{-2}$, or other values within the value range).

For example, in embodiment S1, after the polysilicon gate 330 is formed, the first ion implantation and the second ion implantation are performed in sequence, wherein the energy of the first ion implantation is 250 KeV, an implantation dose of the first ion implantation is $3 \times 10^{12}/cm^{-2}$, the energy of the second ion implantation is 100 KeV, and an implantation dose of the second ion implantation is $2.5 \times 10^{12}/cm^{-2}$.

In embodiment S2, after the polysilicon gate 330 is formed, the first ion implantation and the second ion implantation are performed in sequence, wherein the energy of the first ion implantation is 250 KeV, the implantation dose of the first ion implantation is $3 \times 10^{12}/cm^{-2}$, the energy of the second ion implantation is 100 KeV, and the implantation dose of the second ion implantation is $4 \times 10^{12}/cm^{-2}$.

In embodiment S3, after the polysilicon gate 330 is formed, the first ion implantation and the second ion implantation are performed in sequence, wherein the energy of the first ion implantation is 300 KeV, the implantation dose of the first ion implantation is $2.5 \times 10^{12}/cm^{-2}$, the energy of the second ion implantation is 100 KeV, and the implantation dose of the second ion implantation is $4\times10^{12}/cm^{-2}$.

In example embodiments, in step 204, the at least two times of drift region ion implantation include first-type ion implantation and second-type ion implantation performed in sequence. Energy of the first-type ion implantation is greater than energy of the second-type ion implantation, and the first ion implantation and the second ion implantation belong to the second-type ion implantation.

In example embodiments, the first-type ion implantation includes third ion implantation and fourth ion implantation performed in sequence, ions of the third ion implantation include a second-type impurity, and ions of the fourth ion implantation include a first-type impurity.

For example, after the polysilicon gate 330 is formed, the third ion implantation with energy E3 and a second-type impurity implantation dose D3, the fourth ion implantation with energy E4 and a first-type impurity implantation dose D4, the first ion implantation with the energy E1 and the first-type impurity implantation dose D1, and the second ion implantation with the energy E2 and the first-type impurity implantation dose D2 are performed in sequence, wherein E3>E1, E3>E2, E4>E1, and E4>E2; and In example embodiments, E1>E2.

In example embodiments, the value range of E3 is 550 KeV to 950 KeV (for example, E3 can be 750 KeV or other values within the value range); and the value range of E4 is 350 KeV to 750 KeV (for example, E4 can be 550 KeV or other values within the value range).

In example embodiments, the value range of D3 is $1.5\times10^{12}/cm^{-2}$ to $3.5\times10^{12}/cm^{-2}$ (for example, D3 can be $2.5\times10^{12}/cm^{-2}$ or other values within the value range). In example embodiments, the value range of D4 is $1\times10^{12}/cm^{-2}$ to $3\times10^{12}/cm^{-2}$ (for example, D4 can be $2\times10^{12}/cm^{-2}$ or other values within the value range).

For example, in embodiment S1.1, after the polysilicon gate 330 is formed, the third ion implantation, the fourth ion implantation, the first ion implantation, and the second ion implantation are performed in sequence, wherein the energy of the third ion implantation is 750 KeV, a dose of the third ion implantation is $2.5\times10^{12}/cm^{-2}$, the energy of the fourth ion implantation is 550 KeV, a dose of the fourth ion implantation is $2\times10^{12}/cm^{-2}$, the energy of the first ion implantation is 250 KeV, the implantation dose of the first ion implantation is $3\times10^{12}/cm^{-2}$, the energy of the second ion implantation is 100 KeV, and the implantation dose of the second ion implantation is $2.5\times10^{12}/cm^{-2}$.

In embodiment S2.1, after the polysilicon gate 330 is formed, the third ion implantation, the fourth ion implantation, the first ion implantation, and the second ion implantation are performed in sequence, wherein the energy of the third ion implantation is 750 KeV, the dose of the third ion implantation is $2.5\times10^{12}/cm^{-2}$, the energy of the fourth ion implantation is 550 KeV, the dose of the fourth ion implantation is $2\times10^{12}/cm^{-2}$, the energy of the first ion implantation is 250 KeV, the implantation dose of the first ion implantation is $3\times10^{12}/cm^{-2}$, the energy of the second ion implantation is 100 KeV, and the implantation dose of the second ion implantation is $4\times10^{12}/cm^{-2}$.

In embodiment S3.1, after the polysilicon gate 330 is formed, the third ion implantation, the fourth ion implantation, the first ion implantation, and the second ion implantation are performed in sequence, wherein the energy of the third ion implantation is 750 KeV, the dose of the third ion implantation is $2.5\times10^{12}/cm^{-2}$, the energy of the fourth ion implantation is 550 KeV, the dose of the fourth ion implantation is $2\times10^{12}/cm^{-2}$, the energy of the first ion implantation is 300 KeV, the implantation dose of the first ion implantation is $2.5\times10^{12}/cm^{-2}$, the energy of the second ion implantation is 100 KeV, and the implantation dose of the second ion implantation is $4\times10^{12}/cm^{-2}$.

Step 205: Heavily doped ion implantation is performed, to separately form a source terminal and a channel lead-out terminal in the well doped region and to form a drain terminal in the drift region.

Figure 6:
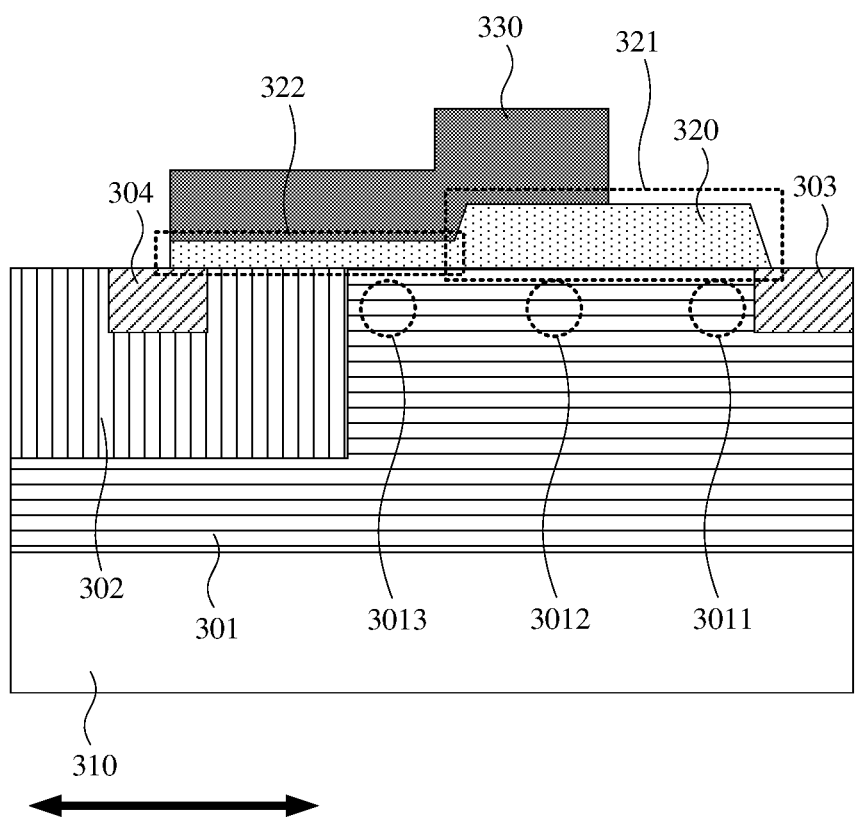
FIG. 6 is a schematic sectional view obtained after source drain ion implantation is performed in the method for making an LDMOS device provided in an exemplary embodiment of the application.
Figure 7:
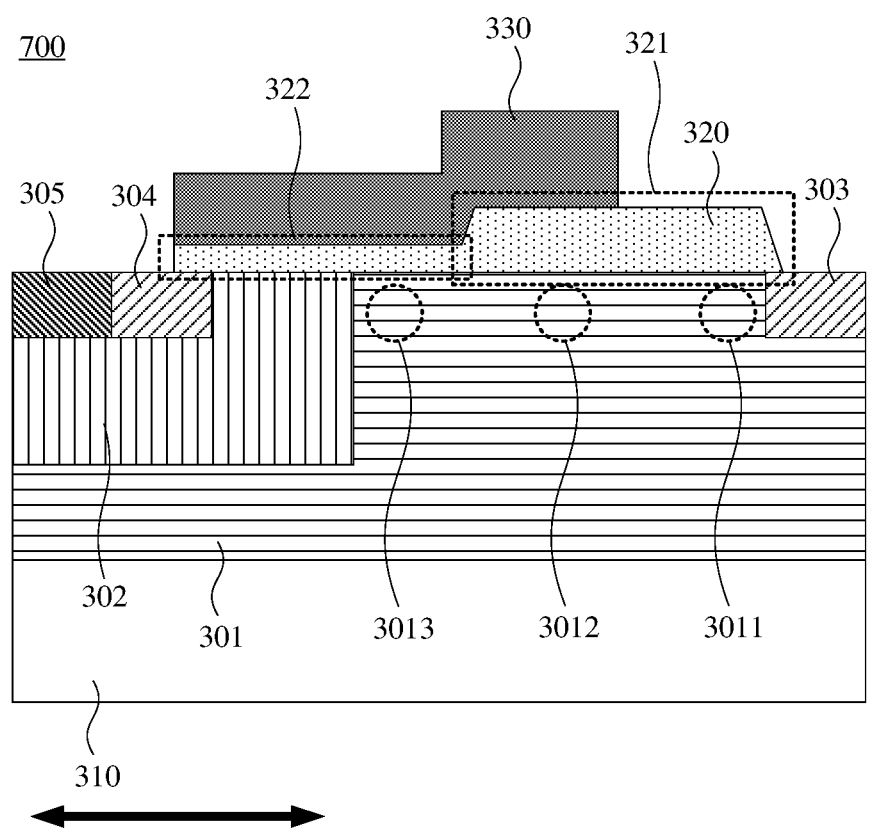
FIG. 7 is a schematic sectional view obtained after channel ion implantation is performed in the method for making an LDMOS device provided in an exemplary embodiment of the application.

In example embodiments, in step 205, the heavily doped ion implantation includes source drain (SD) ion implantation and channel ion implantation. FIG. 6 which illustrates a schematic sectional view obtained after the source drain ion implantation is performed, and FIG. 7 illustrates a schematic sectional view obtained after the channel ion implantation is performed.

Referring to FIG. 6, it can be seen that the source terminal 304 is formed in the well doped region 302 and the drain terminal 303 is formed in the drift region 301 by means of the source drain ion implantation; and referring to FIG. 6, it can be seen that the channel lead-out terminal 305 is formed in the well doped region 302 by means of the channel ion implantation.

The step of drift region ion implantation is performed after the formation of the gate oxide 320 and the polysilicon gate 330. Film layers above different regions of the drift region 301 in the lateral direction have different thicknesses (for example, a film layer above the first region 3011 has a thickness h1, a film layer above the second region 3012 has a thickness h2, and a film layer above the third region 3013 has a thickness h3), such that selective doping can be performed.

The drift region ion implantation is divided into a plurality of times of ion implantation with different energy values. Ions with relatively high energy can pass through the gate oxide 320 and polysilicon gate 330 and are implanted into the entire drift region 301; ions with medium energy are blocked by the high step portion 321 of the gate oxide 320 and the polysilicon gate 330 and are implanted into the remaining region in the drift region 301; and ions with relatively low energy are implanted into a region in the drift region 301 close to the drain terminal 303. Therefore, the doping concentration distribution in the formed drift region 301 along the lateral direction is as follows: the third region 3013 close to the drain terminal 301 has a highest doping concentration, the third region 3013 close to the channel lead-out terminal 305 has a second highest doping concentration, and the second region 3012 below the high step portion 321 where the polysilicon gate 330 is formed thereon has a relatively low doping concentration. In this way, a lateral impurity distribution in the drift region 301 can lead to a relatively uniform electric field distribution.

In the embodiment of the application, ions of the drift region ion implantation and the source drain ion implantation include the first-type impurity; ions of the polysilicon gate 330 and the channel ion implantation include the second-type impurity. If the first-type impurity is a P-type impurity (e.g., boron), the second-type impurity is an N-type impurity (e.g., phosphorus); and if the first-type impurity is an N-type impurity, the second-type impurity is a P-type impurity.

In summary, in the embodiment of the application, in the process of making an LDMOS device, after a gate oxide and a polysilicon gate are formed, drift region ion implantation is performed at least two times; during the drift region ion implantation, ions need to pass through a step structure formed by the gate oxide and the polysilicon gate and an exposed substrate, and the step structure have different thicknesses; and accordingly, a doping concentration distribution in a formed drift region is nonuniform in a lateral direction, such that during operation of the manufactured LDMOS device, there is a relatively uniform electric field in the drift region, thereby reducing the device breakdown probability and improving the device stability.

FIG. 7 illustrates a schematic sectional view of an LDMOS device provided in an exemplary embodiment of the application, wherein the device can be manufactured by means of the making method provided in the above embodiment. Referring to FIG. 7, it can be seen that the LDMOS device 700 includes:

a substrate 310 where a drift region 301 is formed therein, wherein a well doped region 302 is formed in the drift region 301, a doping concentration distribution in the drift region 301 is nonuniform in a lateral direction (e.g., the direction represented by the arrow in FIG. 7), a source terminal 304 and a channel lead-out terminal 305 of the LDMOS device 700 are formed in the well doped region 302, and a drain terminal 303 of the LDMOS device 700 is formed in the drift region 301;

a gate oxide 320 formed on the substrate 310, wherein there is an overlap region between the bottom of the gate oxide and an upper surface of the well doped region 302; and a polysilicon gate 330, wherein the polysilicon gate 330 and the gate oxide 320 form a step structure, and the gate oxide 320 forms a bottom step of the step structure.

In example embodiments, the gate oxide 320 is a step oxide, the step oxide 320 includes a high step portion 321 and a low step portion 322, and the thickness of the high step portion 321 is greater than the thickness of the low step portion 322.

In example embodiments, in the drift region 301, along the lateral direction, the doping concentration of a first region 3011 is greater than the doping concentration of a second region 3012, the doping concentration of a third region 3013 is greater than the doping concentration of the second region 3012, and the doping concentration of the first region 3011 is greater than the doping concentration of the third region 3013. The first region 3011 is a region below the high step portion 321 (i.e., below the high step portion 321 that extends to the outside) where no polysilicon gate 330 is formed thereon, the second region 3012 is a region below the high step portion 321 where the polysilicon gate 330 is formed thereon, and the third region 3013 is a region below the low step portion 322 where the polysilicon gate 330 is formed thereon.

Obviously, the above embodiments are merely examples used for clear description, rather than for limitation on the implementations. One skilled in the art could also make other changes or modifications in different forms on the basis of the above description. There is no need and way to exhaustively list all of the implementations herein, but obvious changes or modifications derived herefrom still fall within the protection scope created by the application.

What is claimed is:
1. A method for making an LDMOS device, comprising:
forming a well doped region in a substrate;
forming a gate oxide on the substrate, wherein there is an overlap region between the bottom of the gate oxide and an upper surface of the well doped region;
forming a polysilicon gate on the gate oxide, wherein the polysilicon gate and the gate oxide form a step structure, the gate oxide forms a bottom step of the step structure, and a lateral length of the gate oxide is greater than a lateral length of the polysilicon gate;
performing drift region ion implantation at least two times to form a drift region in the substrate, wherein the drift region covers the well doped region and the bottom of the gate oxide, a doping concentration distribution in the drift region is nonuniform in a lateral direction and in the at least two times of drift region ion implantation, there is a difference in energy between at least two times of drift region ion implantation, and ions need to pass through the step structure and an exposed substrate during the drift region ion implantation; and
performing heavily doped ion implantation, to separately form a source terminal and a channel lead-out terminal in the well doped region and to form a drain terminal in the drift region.

2. The method according to claim 1, wherein the at least two times of drift region ion implantation comprise first ion implantation and second ion implantation performed in sequence, and energy of the second ion implantation is less than energy of the first ion implantation.

3. The method according to claim 2, wherein the energy of the first ion implantation is 150 KeV to 350 KeV.

4. The method according to claim 3, wherein ions of the first ion implantation comprise a first-type impurity, and in the first ion implantation, an implantation dose of the first-type impurity is $1.5 \times 10^{12}/cm^2$ to $3.5 \times 10^{12}/cm^2$.

5. The method according to claim 2, wherein the energy of the second ion implantation is 50 KeV to 120 KeV.

6. The method according to claim 5, wherein ions of the second ion implantation comprise a first-type impurity, and in the second ion implantation, an implantation dose of the first-type impurity is $2 \times 10^{12}/cm^2$ to $4.5 \times 10^{12}/cm^2$.

7. The method according to claim 2, wherein the at least two times of drift region ion implantation comprise first-type ion implantation and second-type ion implantation performed in sequence, and energy of the first-type ion implantation is greater than energy of the second-type ion implantation; and
the first ion implantation and the second ion implantation belong to the first-type ion implantation.

8. The method according to claim 7, wherein the first-type ion implantation comprises third ion implantation and fourth ion implantation performed in sequence, ions of the third ion implantation comprise a second-type impurity, and ions of the fourth ion implantation comprise a first-type impurity.

9. The method according to claim 8, wherein energy of the third ion implantation is 550 KeV to 950 KeV.

10. The method according to claim 9, wherein in the third ion implantation, an implantation dose of a second-type impurity is $1.5 \times 10^{12}/cm^2$ to $3.5 \times 10^{12}/cm^2$.

11. The method according to claim 9, wherein energy of the fourth ion implantation is 350 KeV to 750 KeV.

12. The method according to claim 11, wherein in the fourth ion implantation, an implantation dose of a first-type impurity is $1 \times 10^{12}/cm^2$ to $3 \times 10^{12}/cm^2$.

13. An LDMOS device, comprising:
a substrate, wherein a drift region is formed in the substrate, a well doped region is formed in the drift region, a doping concentration distribution in the drift region is nonuniform in a lateral direction, a source terminal and a channel lead-out terminal of the LDMOS device are formed in the well doped region, and a drain terminal of the LDMOS device is formed in the drift region;
a gate oxide, wherein the gate oxide is formed on the substrate, and there is an overlap region between the bottom of the gate oxide and an upper surface of the well doped region; and a polysilicon gate, wherein the polysilicon gate and the gate oxide form a step structure, and the gate oxide forms a bottom step of the step structure, and a lateral length of the gate oxide is greater than a lateral length of the polysilicon gate;

wherein the drift region is formed by drift region ion plantation at least two times, there is a difference in energy between at least two times of drift region ion implantation, during the drift region ion implantation, and ions need to pass through the step structure and an exposed substrate during the drift region ion implantation.

14. The device according to claim 13, wherein the gate oxide is a step oxide, the step oxide comprises a high step portion and a low step portion, and the thickness of the high step portion is greater than the thickness of the low step portion.

15. The device according to claim 14, wherein in the drift region, the doping concentration of a first region is greater than the doping concentration of a second region, the doping concentration of a third region is greater than the doping concentration of the second region, and the doping concentration of the first region is greater than the doping concentration of the third region; and wherein the first region is a region below the high step portion where no polysilicon gate is formed thereon, the second region is a region below the high step portion where the polysilicon gate is formed thereon, and the third region is a region below the low step portion where the polysilicon gate is formed thereon.

* * * * *